United States Patent
Choi et al.

(10) Patent No.: US 10,254,321 B2
(45) Date of Patent: Apr. 9, 2019

(54) SYSTEM FOR MONITORING ELECTRIC ENERGY

(71) Applicant: LSIS CO., LTD., Anyang-si, Gyeonggi-do (KR)

(72) Inventors: Hwa-Young Choi, Anyang-si (KR); Hee-Tae Roh, Anyang-si (KR); Young-Gyu Yu, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 113 days.

(21) Appl. No.: 15/358,894

(22) Filed: Nov. 22, 2016

(65) Prior Publication Data

US 2017/0234914 A1   Aug. 17, 2017

(30) Foreign Application Priority Data

Feb. 11, 2016   (KR) .................. 10-2016-0015912

(51) Int. Cl.
*G01R 21/133*   (2006.01)
*H02J 13/00*   (2006.01)
(Continued)

(52) U.S. Cl.
CPC ........... *G01R 21/133* (2013.01); *G01D 4/004* (2013.01); *H02J 3/382* (2013.01); *H02J 13/0006* (2013.01);
(Continued)

(58) Field of Classification Search
CPC .......... G01R 21/133; H02J 3/14; H02J 3/383; G06Q 50/06; G05B 15/02; Y02B 70/3266
(Continued)

(56) References Cited

U.S. PATENT DOCUMENTS 8,200,370 B2 * 6/2012 Paik .................. H02J 3/14
                                                    700/12
8,744,640 B2 * 6/2014 Yonezawa ........ G01D 4/00
                                                    700/295
(Continued)

FOREIGN PATENT DOCUMENTS

JP   2001330630 A   11/2001
JP   2002098720 A   4/2002
(Continued)

OTHER PUBLICATIONS

Partial European Search Report dated Jun. 14, 2017 corresponding to application No. 16196366.5-1568.
(Continued)

*Primary Examiner* — John E Breene
*Assistant Examiner* — Jeffrey P Aiello
(74) *Attorney, Agent, or Firm* — K&L Gates LLP

(57) ABSTRACT

A system for monitoring electric energy amount according to one embodiment of the present disclosure includes an electric energy system including one or more loads receiving electric energy through an external electric energy source and a renewable energy generator, a home server for receiving information of a first electric energy amount that is an electric energy amount consumed by the one or more loads, a second electric energy amount that is supplied from the external electric energy source to the electric energy system, and a third electric energy amount that is supplied from the renewable energy generator to the electric energy system, and an electric energy amount monitoring server calculating the second electric energy amount or the third electric energy amount from electric energy consumption of the electric energy system, which is received from the home server, and supply electric energy amount information supplied to the electric energy system.

4 Claims, 5 Drawing Sheets

(51) Int. Cl.
  *G01D 4/00* (2006.01)
  *H02J 3/38* (2006.01)
(52) U.S. Cl.
  CPC ........... *Y02B 70/346* (2013.01); *Y02B 90/242* (2013.01); *Y02B 90/248* (2013.01); *Y02E 40/72* (2013.01); *Y04S 10/123* (2013.01); *Y04S 20/322* (2013.01); *Y04S 20/38* (2013.01); *Y04S 20/52* (2013.01); *Y04S 20/525* (2013.01)
(58) Field of Classification Search
  USPC .................................. 700/291, 295; 702/62
  See application file for complete search history.

(56) References Cited

U.S. PATENT DOCUMENTS

| | | | | |
|---|---|---|---|---|
| 2008/0167756 | A1* | 7/2008 | Golden | G05B 15/02 700/297 |
| 2011/0251807 | A1 | 10/2011 | Rada et al. | |
| 2012/0059775 | A1* | 3/2012 | Oh | G06Q 50/06 705/412 |
| 2012/0271576 | A1* | 10/2012 | Kamel | H02J 13/0006 702/62 |
| 2014/0222237 | A1 | 8/2014 | Hibiya et al. | |
| 2015/0253364 | A1* | 9/2015 | Hieda | H04Q 9/00 702/62 |
| 2015/0355246 | A1* | 12/2015 | Choe | G01R 21/133 702/60 |
| 2015/0355247 | A1* | 12/2015 | Choe | G01R 21/133 702/60 |

FOREIGN PATENT DOCUMENTS

| | | |
|---|---|---|
| JP | 2004012376 A | 1/2004 |
| JP | 2006153571 A | 6/2006 |
| JP | 3875149 B2 | 1/2007 |
| JP | 2008199734 A | 8/2008 |
| JP | 2011083085 A | 4/2011 |
| JP | 2012191777 A | 10/2012 |
| JP | 2013183613 A | 9/2013 |
| JP | 2013222293 | 10/2013 |
| JP | 2014039352 A | 2/2014 |
| JP | 2015010941 A | 1/2015 |
| JP | 2015227811 A | 12/2015 |
| JP | 2017041251 A | 2/2017 |
| JP | 2017042037 A | 2/2017 |
| KR | 20110011045 A | 2/2011 |
| KR | 101318891 B1 | 10/2013 |
| WO | 01/77696 A1 | 10/2001 |
| WO | 2015028944 A1 | 3/2015 |
| WO | 2015/083393 A1 | 6/2015 |
| WO | 2015083397 A1 | 11/2015 |

OTHER PUBLICATIONS

Japanese Office Action for related Japanese Application No. 2016-234567; action dated Nov. 28, 2017; (4 pages).
Japanese Office Action for related Japanese Application No. 2016-234567; action dated Jul. 17, 2018; (3 pages).
Japanese Office Action for related Japanese Application No. 2016-234567; action dated Jan. 29, 2019; (3 pages).

* cited by examiner

- Prior Art -

… (1) …

SYSTEM FOR MONITORING ELECTRIC ENERGY

CROSS REFERENCE TO RELATED APPLICATION

This application claims the benefit of Korean Patent Application No. 10-2016-0015912, filed on Feb. 11, 2016, entitled "SYSTEM FOR MONITORING ELECTRIC ENERGY", which is hereby incorporated by reference in its entirety into this application.

BACKGROUND

1. Technical Field

The present disclosure relates to a system for monitoring electric energy.

2. Description of the Related Art

A system for monitoring electric energy refers to a system capable of performing a remote metering, a bidirectional communication between an electric energy provider and a consumer, and measurement per time slot. The system for monitoring electric energy performs a metering at every 15 minute interval to more frequently provide energy usage information than a conventional remote metering which is performed once a month.

However, there is a limitation to reducing energy using only information provided from a system for monitoring electric energy. That is, a conventional system for monitoring electric energy may recognize only an overall electric energy consumption at home instead of electric energy consumption of each of electronic devices at home. Therefore, a user does not know generally which electronic device should be managed to use in order to reduce electric energy consumption. Also, it may be inefficient to attach a watt-hour meter to each of the electronic devices in order to recognize electric energy consumption thereof.

FIG. 1 is a diagram illustrating a conventional system for monitoring electric energy. Referring to FIG. 1, the conventional system for monitoring electric energy may monitor overall electric energy being supplied to each of loads 40. At this point, the loads 40 receiving electric energy may be home appliances which are used at home.

However, as described above, there is a problem in that the conventional system for monitoring electric energy may recognize only an overall electric energy consumption at home instead of electric energy consumption of each of electronic devices at home. Also, there is a problem in that the conventional system for monitoring electric energy cannot receive or measure an electric energy amount being supplied from the outside and an additional device for receiving or measuring the electric energy amount is required. That is, there is a problem in that the conventional system for monitoring electric energy requires an additional communication device so as to receive electric energy amount being supplied from the outside so that a communication cost is increased. Also, there is a problem in that the conventional system for monitoring electric energy is provided with an additional device so as to measure an electric energy amount being supplied from the outside so that a system construction cost is increased.

SUMMARY

An object of the present disclosure is to provide a system for monitoring electric energy capable of reducing a communication cost by receiving an electric energy amount from a home server.

Another object of the present disclosure is to provide a system for monitoring electric energy capable of reducing a system construction cost by allowing a monitoring unit to determine a supply electric energy amount of an external electric energy source or a renewable energy generator.

Still another object of the present disclosure is to provide a system for monitoring electric energy capable of providing an electric energy amount when a communication device fails by subtracting the electric energy amount, which is supplied from a renewable energy generator to an electric energy system, from overall electric energy consumption of loads, to calculate the electric energy amount supplied from an external electric energy source to the electric energy system.

Yet another object of the present disclosure is to provide a system for monitoring electric energy capable of providing an electric energy amount when a communication device fails by subtracting the electric energy amount, which is supplied from an external electric energy source to an electric energy system, from overall electric energy consumption of loads, to calculate the electric energy amount supplied from a renewable energy generator to the electric energy system.

Still yet another object of the present disclosure is to provide a system for monitoring electric energy capable of providing an electric energy amount consumed by each of one or more loads by receiving an overall electric energy amount consumed by the one or more loads to calculate the electric energy amount consumed by each of one or more loads.

The object of the present disclosure is not limited to the above described objects, and other objects and advantages not mentioned above will be understood by the following description, and further will be more apparently by embodiments of the present disclosures. Also, it will be easily understood that the objects and advantages of the present disclosure can be implemented through means and a combination thereof which are defined in the appended claims.

To attain the objects described above, a system for monitoring electric energy amount according to one embodiment of the present disclosure includes an electric energy system including one or more loads receiving electric energy through an external electric energy source and a renewable energy generator, a home server configured to receive information of a first electric energy amount that is an electric energy amount consumed by the one or more loads, a second electric energy amount that is supplied from the external electric energy source to the electric energy system, and a third electric energy amount that is supplied from the renewable energy generator to the electric energy system, and an electric energy amount monitoring server configured to calculate the second electric energy amount or the third electric energy amount from electric energy consumption of the electric energy system, which is received from the home server, and supply electric energy amount information supplied to the electric energy system.

Also, to attain the objects described above, a system for monitoring electric energy amount according to another embodiment of the present disclosure includes an electric energy system including one or more loads receiving electric energy through an external electric energy source and a renewable energy generator, a home server configured to receive information of a first electric energy amount that is an electric energy amount consumed by the one or more loads, a second electric energy amount that is supplied from the external electric energy source to the electric energy system, and a third electric energy amount that is supplied from the renewable energy generator to the electric energy system, and an electric energy amount monitoring server configured to calculate an electric energy amount consumed by each of the one or more loads by receiving an overall electric energy amount consumed by the one or more loads.

In accordance with the present disclosure as described above, an electric energy amount is received from a home server so that there is an effect in which a communication cost may be reduced.

Also, in accordance with the present disclosure, a monitoring unit determines a supply electric energy amount of an external electric energy source or a renewable energy generator so that there is an effect in which a system construction cost may be reduced.

Further, in accordance with the present disclosure, an electric energy amount supplied from an external electric energy source to an electric energy system is calculated by subtracting an electric energy amount, which is supplied from a renewable energy generator to an electric energy system, from overall electric energy consumption by loads, so that there is an effect in which the electric energy amount may be provided when a communication device fails.

Moreover, in accordance with the present disclosure, an electric energy amount supplied from a renewable energy generator to an electric energy system is calculated by subtracting an electric energy amount, which is supplied from an external electric energy source to an electric energy system, from overall electric energy consumption by loads, so that there is an effect in which the electric energy amount may be provided when a communication device fails.

Additionally, in accordance with the present disclosure, an electric energy amount consumed by each of one or more loads is calculated by receiving an overall electric energy amount consumed by one or more loads so that there is an effect in which the electric energy amount consumed by each of one or more loads may be provided.

DETAILED DESCRIPTION

Figure 1:
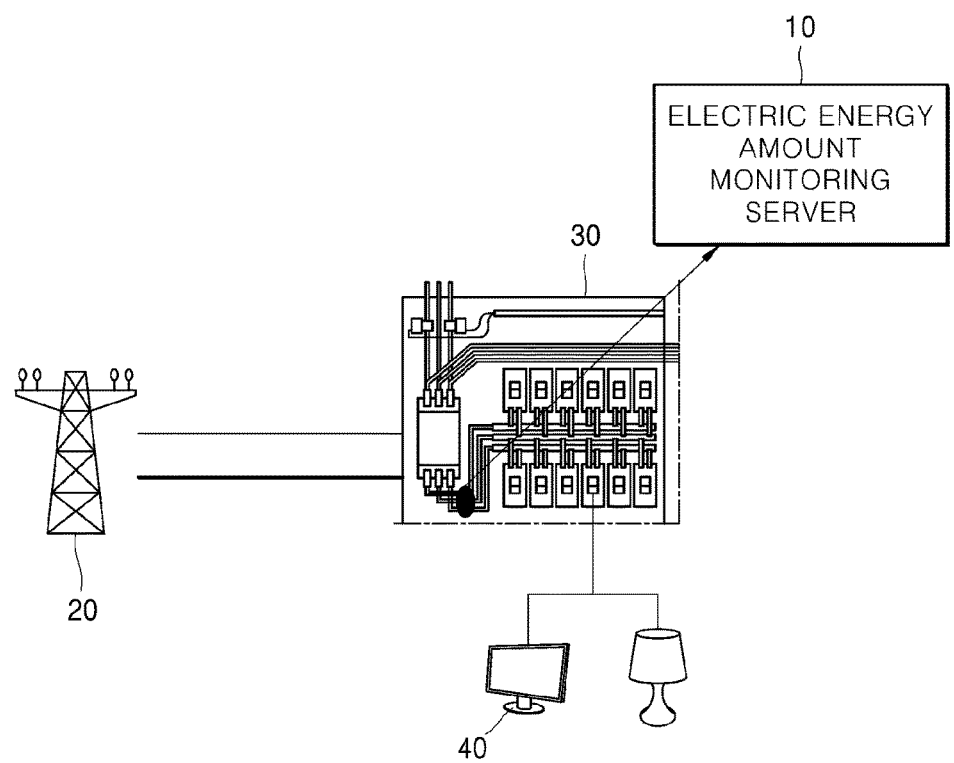
FIG. 1 is a diagram illustrating a conventional system for monitoring electric energy.

The above and other objects, features and advantages of the present disclosure will be described later in detail with reference to the accompanying drawings, and thus the technical spirit of the present disclosure can be easily implemented by those skilled in the art. In the following description of the present disclosure, if a detailed description of known configurations and functions is determined to obscure the interpretation of embodiments of the present disclosure, the detailed description thereof will be omitted. Hereinafter, preferred embodiments according to the present disclosure will be described in detail with reference to the accompanying drawings. In the drawings, the same reference numerals refer to the same or similar elements throughout.

Figure 2:
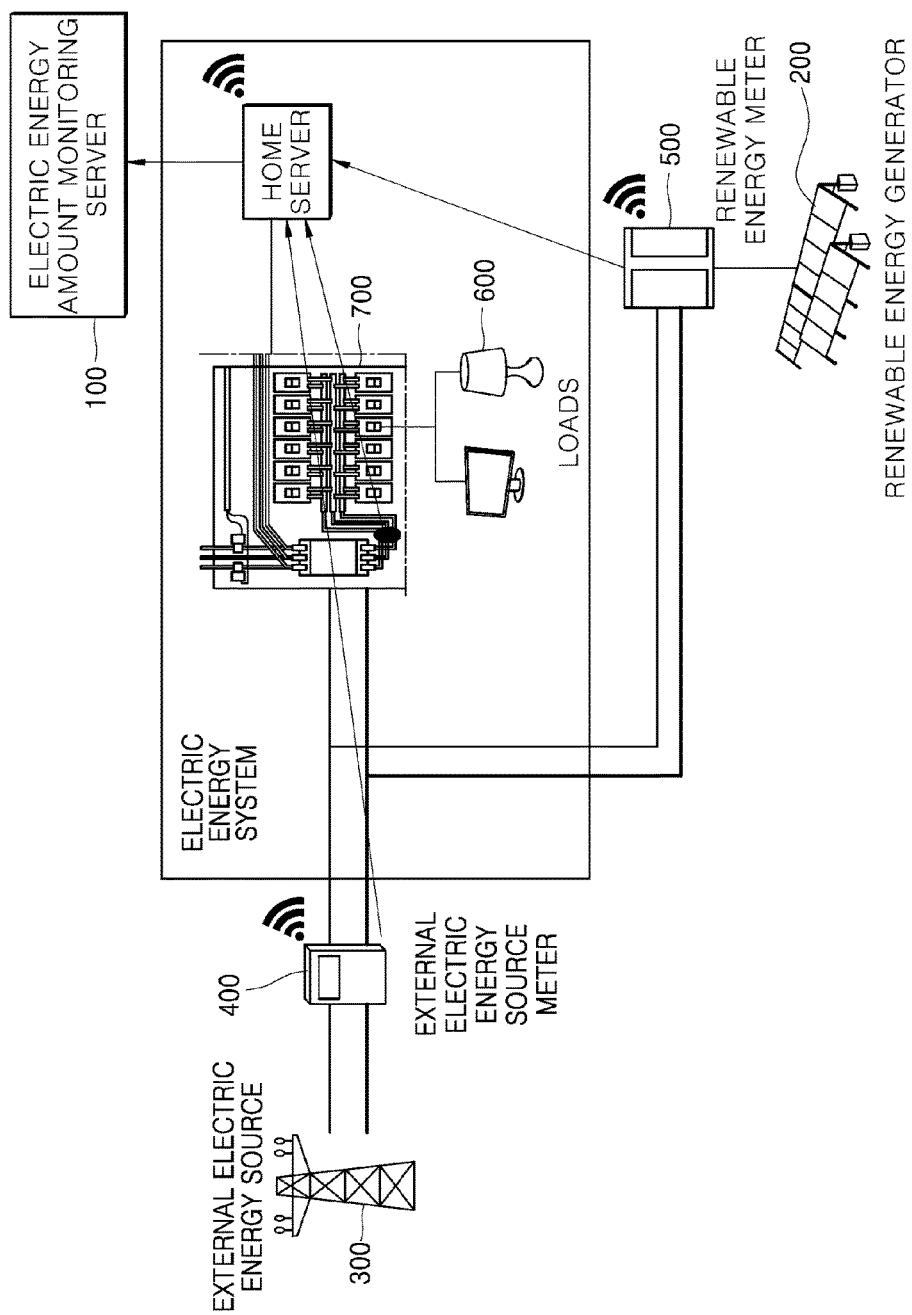
FIG. 2 is a diagram illustrating a system for monitoring electric energy according to one embodiment of the present disclosure.

FIG. 2 is a diagram illustrating a system for monitoring electric energy according to one embodiment of the present disclosure. Referring to FIG. 2, the system for monitoring electric energy according to one embodiment of the present disclosure may be configured to include an electric energy system, a home server, and an electric energy amount monitoring server. The system for monitoring electric energy shown in FIG. 2 is according to one embodiment, components thereof are not limited to the embodiment shown in FIG. 2, and some components may be added, changed, or omitted as necessary.

Figure 3:
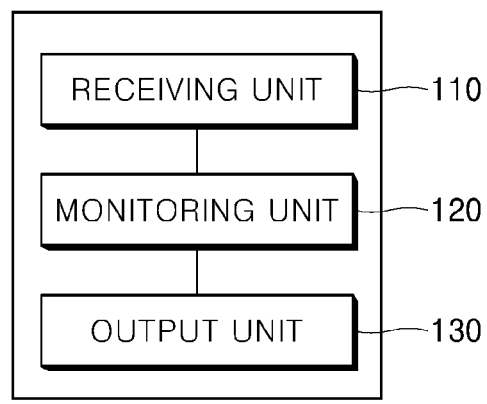
FIG. 3 is a diagram illustrating an electric energy amount monitoring server according to one embodiment of the present disclosure.

FIG. 3 is a diagram illustrating an electric energy amount monitoring server according to one embodiment of the present disclosure. Hereinafter, a system for monitoring electric energy according to one embodiment of the present disclosure will be described with reference to FIGS. 2 and 3.

An electric energy system may include one or more loads 600 receiving electric energy through an external electric energy source 300 and a renewable energy generator 200. As one embodiment, the loads 600 may be home appliances installed at home, and the external electric energy source 300 may be a power plant or a substation which generates electric energy to supply the electric energy to the electric energy system. The electric energy system refers to an assembly which is configured with an electric meter, electronic devices, and the like inside home.

Meanwhile, renewable energy is clean energy capable of substituting for fossil fuel and nuclear power, and includes solar energy, wind power, water power, bio energy, and the like. The renewable energy generator 200 is a device capable of producing renewable energy, and may be located inside or outside of the electric energy system.

A home server may receive a first electric energy amount that is electric energy amount consumed by the one or more loads 600. Also, the home server may receive a second electric energy amount supplied from the external electric energy source 300 to the electric energy system, and a third electric energy amount supplied from the renewable energy generator 200 to the electric energy system.

The home server is a kind of a computer device which stores, integrates, and distributes information of various media such as a video, a telephone, Web, an e-mail, a facsimile, and the like at home. The home server may serve to store and redistribute external contents which are transmitted to home through a broadcast, a telephone, and Internet. Also, the home server may be used as a device for storing a digital image and a digital music, and may serve as an information control center of home.

As one embodiment, the home server may receive the first electric energy amount from a panel board 700, the second electric energy amount from an external electric energy source meter 400, and the third electric energy amount from a renewable energy meter 500. At this point, the external electric energy source meter 400 may be a smart meter which measures the second electric energy amount supplied from the external electric energy source 300 to the electric energy system. In accordance with one embodiment of the present disclosure, there is an effect in that the home server receives the first electric energy amount, the second electric energy amount, and the third electric energy amount so that a communication cost is reduced.

An electric energy amount monitoring server 100 may calculate or determine the second electric energy amount or the third electric energy amount from electric energy consumption of the electric energy system, which is received from the home server, and supply electric energy amount information supplied to the electric energy system. The electric energy consumption of the electric energy system, which is received from the home server, may be the first electric energy amount that is an electric energy amount consumed by one or more loads. Meanwhile, the supply electric energy amount information supplied to the electric energy system may be a sum of the second electric energy amount and the third electric energy amount.

As one embodiment, the electric energy amount monitoring server 100 may include a receiving unit, a monitoring unit, and an output unit, and the receiving unit may receive the electric energy consumption and the supply electric energy amount information from the home server. The monitoring unit may calculate a first estimated supply electric energy amount using the first electric energy amount and the second electric energy amount. Thereafter, at least one of the first estimated supply electric energy amount and the third electric energy amount may be determined as a supply electric energy amount of the renewable energy generator 200. The first estimated supply electric energy amount may be the same as or different from the third electric energy amount. In accordance with one embodiment of the present disclosure, there is an advantage in which at least one of the first estimated supply electric energy amount and the third electric energy amount is determined as the supply electric energy amount of the renewable energy generator 200 so that an accurate supply electric energy amount may be calculated.

As one embodiment, a monitoring unit 120 may calculate the first estimated supply electric energy amount by subtracting the second electric energy amount from the first electric energy amount. The first electric energy amount is electric energy consumption of each of the loads 600, the second electric energy amount is an electric energy amount supplied from the external electric energy source 300, and the third electric energy amount is an electric energy amount supplied from the renewable energy generator 200. Therefore, a sum of the second electric energy amount and the third electric energy amount is the same as the first electric energy amount, and the first estimated supply electric energy amount and the third electric energy amount are the same as each other. To summary the above described process, it will be the following Equation 1.

$$P_{A1} = P_1 - P_2$$

$$P_1 = P_2 + P_3$$

$$P_{A1} = P_3 \quad \text{[Equation 1]}$$

Here, $P_{A1}$ is the first estimated supply electric energy amount, $P_1$ is the first electric energy amount, $P_2$ is the second electric energy amount, and $P_3$ is the third electric energy amount.

Meanwhile, the monitoring unit 120 may calculate the second electric energy amount by subtracting the third electric energy amount from the first electric energy amount. In accordance with one embodiment of the present disclosure, when the second electric energy amount is not received, it is calculated by subtracting the third electric energy amount from the first electric energy amount so that there is an effect in that an electric energy amount may be provided when a communication device fails.

As one embodiment, the first electric energy amount may be an overall electric energy amount consumed by the one or more loads 600, or may be an electric energy amount consumed by each of the one or more loads 600. Also, the monitoring unit 120 may calculate the electric energy amount consumed by each of the one or more loads 600 by receiving the overall electric energy amount consumed by the one or more loads 600. For example, the monitoring unit 120 may calculate the electric energy amount consumed by each of the one or more loads 600 using a non-intrusive load monitoring (NILM) method. The NILM is a technique that measures a supply of overall voltage and current to predict electric energy consumption with respect to each of the loads 600 at home and a driving schedule of an electricity generation.

More particularly, the monitoring unit 120 may analyze variation of an electrical characteristic measured by a receiving unit 110, and identifies home appliances as electric energy consuming subjects on the basis of the analyzed result. Also, the monitoring unit 120 may predict electric energy consumption of the identified home appliance. For this purpose, the monitoring unit 120 may include a data collection unit, a data process unit, an event detection unit, a feature extraction unit, a device identification unit, and an electric energy determination unit.

The data collection unit captures raw data received from the receiving unit 110. The data process unit aligns a current signal to a voltage signal with respect to the raw data captured by the data collection unit to obtain an appropriate phase relationship. Also, data is generalized in order for standardization and a filtering for extracting a harmonic characteristic (for example, a current harmonic power (CHP)) is performed. Specifically, an apparent power amount and an active power amount of the first electric energy amount are obtained, and power factor is calculated from the apparent power amount and the active power amount.

The event detection unit detects an event generated at home appliance on the basis of variation of the power factor (due to an ON/OFF switching of the home appliance or a switching of an operation state thereof) provided from the data process unit.

The feature extraction unit extracts an ON/OFF time of a home appliance and a pattern of electric energy consumption thereof. For example, a pattern of electric energy consumption of a washing machine is significantly different when a rotating tub is rotated from when the rotating tub is not rotated. Also, a rotational speed of the rotating tub is significantly different in a washing cycle from in a spin dry cycle so that, at this point, a pattern of electric energy consumption is also significantly different in those cycles. However, a television shows a constant pattern of electric energy consumption with no significant variation when being powered so that the pattern of electric energy consumption of the television is significantly different from that of the washing machine, which is described above. The feature extraction unit extracts an intrinsic characteristic of such a pattern of electric energy consumption of the home appliance.

The device identification unit compares and analyzes the pattern of electric energy consumption extracted from the feature extraction unit with reference data to determine a kind of the corresponding home appliance and an operation state through whether the pattern of electric energy consumption and the reference data correspond to each other. Specifically, the device identification unit may identify a plurality of home appliances from each other when the plurality of home appliances are simultaneously used using a coefficient of a CHP which is obtained by the data collection unit and the data process unit.

The electric energy determination may calculate an electric energy amount of a corresponding home appliance using the kind of the corresponding home appliance and an operation state thereof which are identified in the device identification unit.

The output unit 130 may output one or more among the first electric energy amount, the second electric energy amount, the third electric energy amount, and the electric energy amount consumed by each of the one or more loads 600. In accordance with one embodiment of the present disclosure, one or more among the first electric energy amount, the second electric energy amount, the third electric energy amount, and the electric energy amount consumed by each of the one or more loads 600 are output so that a user may recognize each of them at a time.

To describe again the system for monitoring electric energy according to one embodiment of the present disclosure with reference to FIGS. 2 and 3, the electric energy monitoring server may include the receiving unit, the monitoring unit, and the output unit, and the receiving unit may receive the electric energy consumption and the supply electric energy amount information from the home server. The monitoring unit may calculate a second estimated supply electric energy amount using the first electric energy amount and the third electric energy amount. Thereafter, at least one of the second estimated supply electric energy amount and the second electric energy amount may be determined as a supply electric energy amount of the external electric energy source. The second estimated supply electric energy amount may be the same as or different from the second electric energy amount. In accordance with one embodiment of the present disclosure, at least one of the second estimated supply electric energy amount and the second electric energy amount is determined as the supply electric energy amount of the external electric energy source so that there is an advantage in which an accurate supply electric energy amount may be calculated.

As one embodiment, the monitoring unit 120 may calculate the second estimated supply electric energy amount by subtracting the third electric energy amount from the first electric energy amount. The first electric energy amount is electric energy consumption of each of the loads 600, the second electric energy amount is an electric energy amount supplied from the external electric energy source 300, and the third electric energy amount is an electric energy amount supplied from the renewable energy generator 200. Therefore, a sum of the second electric energy amount and the third electric energy amount may be the same as the first electric energy amount, and the second estimated supply electric energy amount and the second electric energy amount may be the same as each other. To summary the above described process, it will be the following Equation 2.

$$P_{A2}=P_1-P_3$$

$$P_1=P_2+P_3$$

$$P_{A2}=P_2 \qquad \text{[Equation 2]}$$

Here, $P_{A2}$ is the second estimated supply electric energy amount, $P_1$ is the first electric energy amount, $P_2$ is the second electric energy amount, and $P_3$ is the third electric energy amount.

Meanwhile, the monitoring unit 120 may calculate the third electric energy amount by subtracting the second electric energy amount from the first electric energy amount. In accordance with one embodiment of the present disclosure, when the third electric energy amount is not received, it is calculated by subtracting the second electric energy amount from the first electric energy amount so that there is an effect in that an electric energy amount may be provided when a communication device fails.

As one embodiment, the first electric energy amount may be an overall electric energy amount consumed by the one or more loads 600, or may be an electric energy amount consumed by each of the one or more loads 600. Also, the monitoring unit 120 may receive the overall electric energy amount consumed by the one or more loads 600 to calculate the electric energy amount consumed by each of the one or more loads 600. A method, in which a monitoring unit receives an overall electric energy amount consumed by one or more loads 600 to calculate an electric energy amount consumed by each of one or more loads, may be the same as the method described in the above embodiment.

Figure 4:
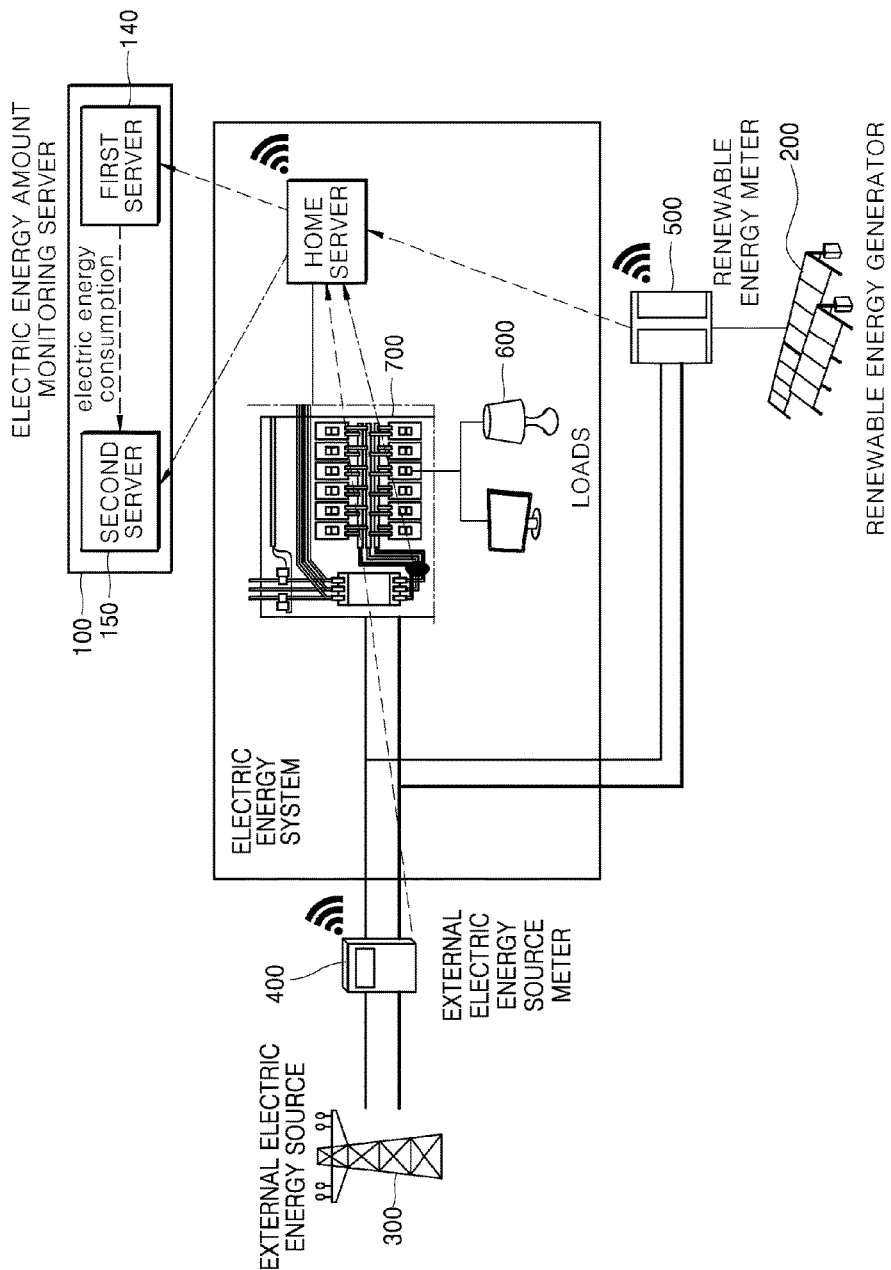
FIG. 4 is a diagram illustrating a system for monitoring electric energy according to another embodiment of the present disclosure.
Figure 5:
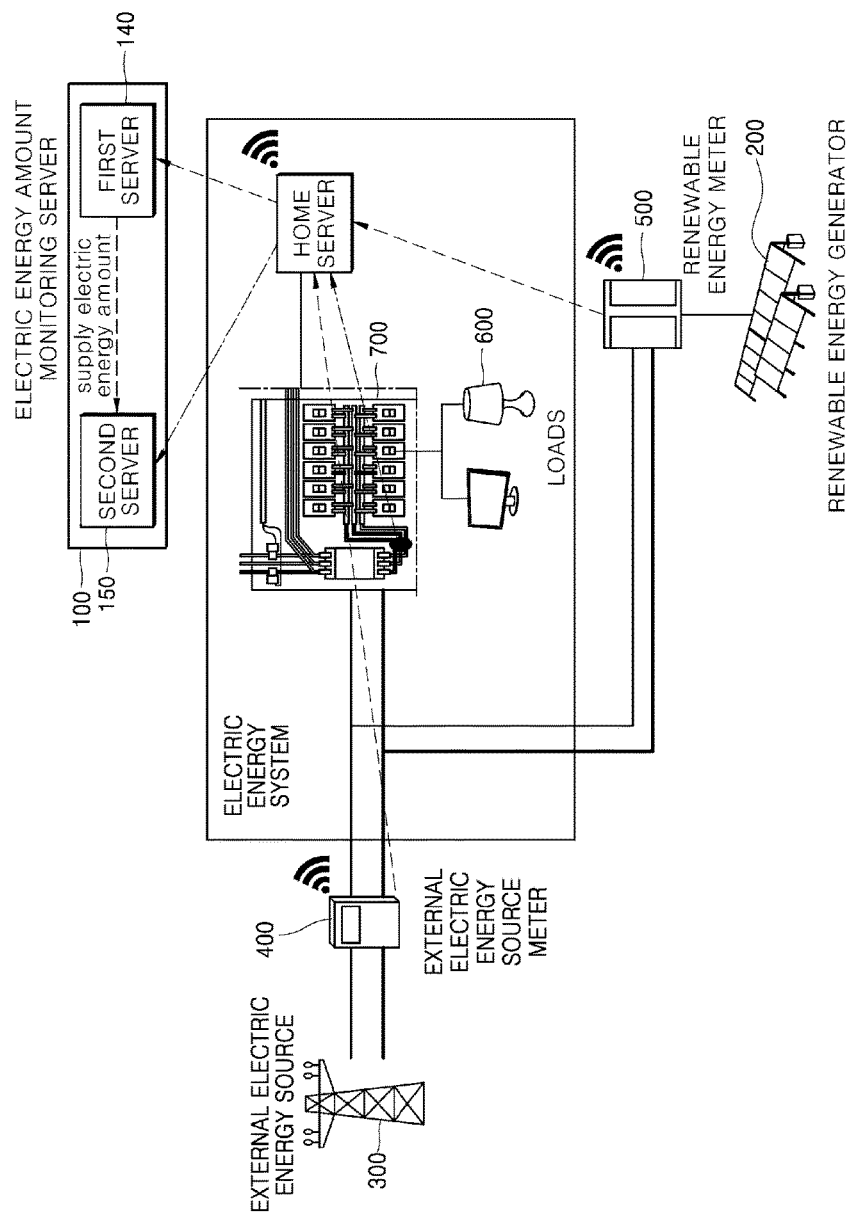
FIG. 5 is a diagram illustrating a system for monitoring electric energy according to still another embodiment of the present disclosure.

FIG. 4 is a diagram illustrating a system for monitoring electric energy according to another embodiment of the present disclosure, and FIG. 5 is a diagram illustrating a system for monitoring electric energy according to still another embodiment of the present disclosure. Hereinafter, a system for monitoring electric energy will be described with reference to FIGS. 4 and 5.

Referring to FIGS. 4 and 5, an electric energy amount monitoring server may include a first server and a second server. The first server may receive one of electric energy consumption and supply electric energy amount information from a home server. The second server may receive the other of the electric energy consumption and the supply electric energy amount information, which is not received by the first server, from the home server, and may calculate or determine a second electric energy amount or a third electric energy amount by receiving electric energy amount information, which is received by the first server, therefrom.

Referring to FIG. 4, the electric energy consumption is transmitted from the home server to the second server via the first server, and a supply electric energy amount is transmitted from the home server to the second server. Referring to FIG. 5, the electric energy consumption is transmitted from the home server to the second server, and the supply electric energy amount is transmitted from the home server to the second server via the first server.

As one embodiment, the second server may calculate the third electric energy amount by subtracting the second electric energy amount from a first electric energy amount, or may calculate the second electric energy amount by subtracting the third electric energy amount from the first electric energy amount. A method for calculating the third electric energy amount and the second electric energy amount may be the same as that described in FIGS. 2 and 3.

Meanwhile, the first electric energy amount may include an overall electric energy amount which is consumed by one or more loads. Also, the second server may calculate an electric energy amount consumed by one or more loads based on the overall electric energy amount consumed by them. For example, the second server may calculate an electric energy amount consumed by each of one or more loads 600 using an NILM method. The NILM is a technique that measures a supply of overall voltage and current to predict electric energy consumption with respect to each of the loads 600 at home and a driving schedule of an electricity generation.

In accordance with the present disclosure as described above, an electric energy amount is received from a home server so that there is an effect in which a communication cost may be reduced. Also, in accordance with the present disclosure, a monitoring unit determines a supply electric energy amount of an external electric energy source or a renewable energy generator so that there is an effect in which a system construction cost may be reduced.

Further, in accordance with the present disclosure, an electric energy amount supplied from an external electric energy source to an electric energy system is calculated by subtracting an electric energy amount, which is supplied from a renewable energy generator to an electric energy system, from overall electric energy consumption by loads, so that there is an effect in which the electric energy amount may be provided when a communication device fails.

Moreover, in accordance with the present disclosure, an electric energy amount supplied from a renewable energy generator to an electric energy system is calculated by subtracting an electric energy amount, which is supplied from an external electric energy source to an electric energy system, from overall electric energy consumption by loads, so that there is an effect in which the electric energy amount may be provided when a communication device fails.

Additionally, in accordance with the present disclosure, an electric energy amount consumed by each of one or more loads is calculated by receiving an overall electric energy amount consumed by one or more loads so that there is an effect in which the electric energy amount consumed by each of one or more loads may be provided.

Although the present disclosure has been described with reference to the embodiments, it should be understood that numerous other substitutions, modifications and alterations can be devised by those skilled in the art without departing the technical spirit of this disclosure, and thus it should be construed that the present disclosure is not limited by the embodiments described above and the accompanying drawings.

What is claimed is:

1. A system for monitoring an electric energy amount, the system comprising:
    an electric energy system including one or more loads to which an external electric energy source and a renewable energy generator supply electric energy;
    a home server configured to receive information of a first electric energy amount that is an electric energy amount consumed by the one or more loads from a panel board connecting to the one or more loads, to receive information of a second electric energy amount that is supplied from the external electric energy source to the electric energy system from an external electric energy source meter connecting to the external electric energy source, and to receive information of a third electric energy amount that is supplied from the renewable energy generator to the electric energy system from a renewable energy meter connecting to the renewable energy generator; and
    an electric energy amount monitoring server configured to receive the information of the first electric energy amount and at least one of the information of the second electric energy amount and the information of the third electric energy amount from the home server, and to calculate either the information of the second electric energy amount or the information of the third electric energy amount based on consumption electric energy amount information of the electric energy system, corresponding to the information of the first electric energy amount and supply electric energy amount information of the electric energy system corresponding to at least one of the information of the second electric energy amount and the information of the third electric energy amount,
    wherein the electric energy amount monitoring server includes a first server and a second server, and
    wherein any one of the first server and the second server is configured to receive the information of the first electric energy amount from the home server, and the other of the first server and the second server is configured to receive any one of the information of the second electric energy amount and the information of the third electric energy amount from the home server, to receive the information of the first electric energy amount from the one of the first server and the second server, and to calculate the other of the information of the second electric energy amount and the information of the third electric energy amount based on the information of the first electric energy amount and the one of the information of the second electric energy amount and the information of third electric energy amount.

2. The system of claim 1, wherein the second server calculates the third electric energy amount by subtracting the second electric energy amount from the first electric energy amount.

3. The system of claim 1, wherein the second server calculates the second electric energy amount by subtracting the third electric energy amount from the first electric energy amount.

4. The system of claim 1, wherein the first electric energy amount includes an overall electric energy amount consumed by the one or more loads, and the second server calculates an electric energy amount consumed by each of the one or more loads based on the overall electric energy amount consumed by the one or more loads.

* * * * *